(12) United States Patent
Vandergrift

(10) Patent No.: US 8,218,281 B2
(45) Date of Patent: Jul. 10, 2012

(54) CONTROL CIRCUIT FOR CONTROLLING A SEMICONDUCTOR SWITCH SYSTEM

(75) Inventor: Adrian E. Vandergrift, Rockton, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 420 days.

(21) Appl. No.: 12/467,452

(22) Filed: May 18, 2009

(65) Prior Publication Data
US 2010/0290167 A1    Nov. 18, 2010

(51) Int. Cl.
*H02H 9/02* (2006.01)
(52) U.S. Cl. ....................... 361/93.9; 361/93.7
(58) Field of Classification Search ......... 361/93.7–93.9
See application file for complete search history.

(56) References Cited

U.S. PATENT DOCUMENTS

| | | | |
|---|---|---|---|
| 4,404,473 A * | 9/1983 | Fox | 307/125 |
| 5,444,590 A | 8/1995 | LeComte et al. | |
| 5,898,557 A * | 4/1999 | Baba et al. | 361/103 |
| 6,043,703 A | 3/2000 | Bavol | |
| 6,125,024 A | 9/2000 | LeComte et al. | |
| 6,198,613 B1 | 3/2001 | Rozman | |
| 6,252,751 B1 | 6/2001 | Rozman | |
| 6,470,224 B1 | 10/2002 | Drake et al. | |
| 6,504,730 B1 | 1/2003 | Cooney et al. | |
| 6,606,228 B1 * | 8/2003 | Potter, IV | 361/104 |
| 6,631,065 B2 | 10/2003 | Sugiyama et al. | |
| 6,856,045 B1 | 2/2005 | Beneditz et al. | |
| 7,030,769 B2 | 4/2006 | Miller | |
| 7,075,373 B2 | 7/2006 | Briskin et al. | |

FOREIGN PATENT DOCUMENTS

| | | |
|---|---|---|
| EP | 0 743 751 A2 | 11/1996 |
| GB | 2 429 347 A | 2/2007 |

OTHER PUBLICATIONS

European Search Report for EP Application No. 10250946.0, Aug. 5, 2010.

* cited by examiner

*Primary Examiner* — Danny Nguyen
(74) *Attorney, Agent, or Firm* — Carlson Gaskey & Olds P.C.

(57) ABSTRACT

A power distribution system and method has a controller and at least one semiconductor switch. The power distribution system additionally has an on status detector which detects the status of the semiconductor switches, and an overcurrent status circuit which checks for overcurrent conditions.

10 Claims, 3 Drawing Sheets

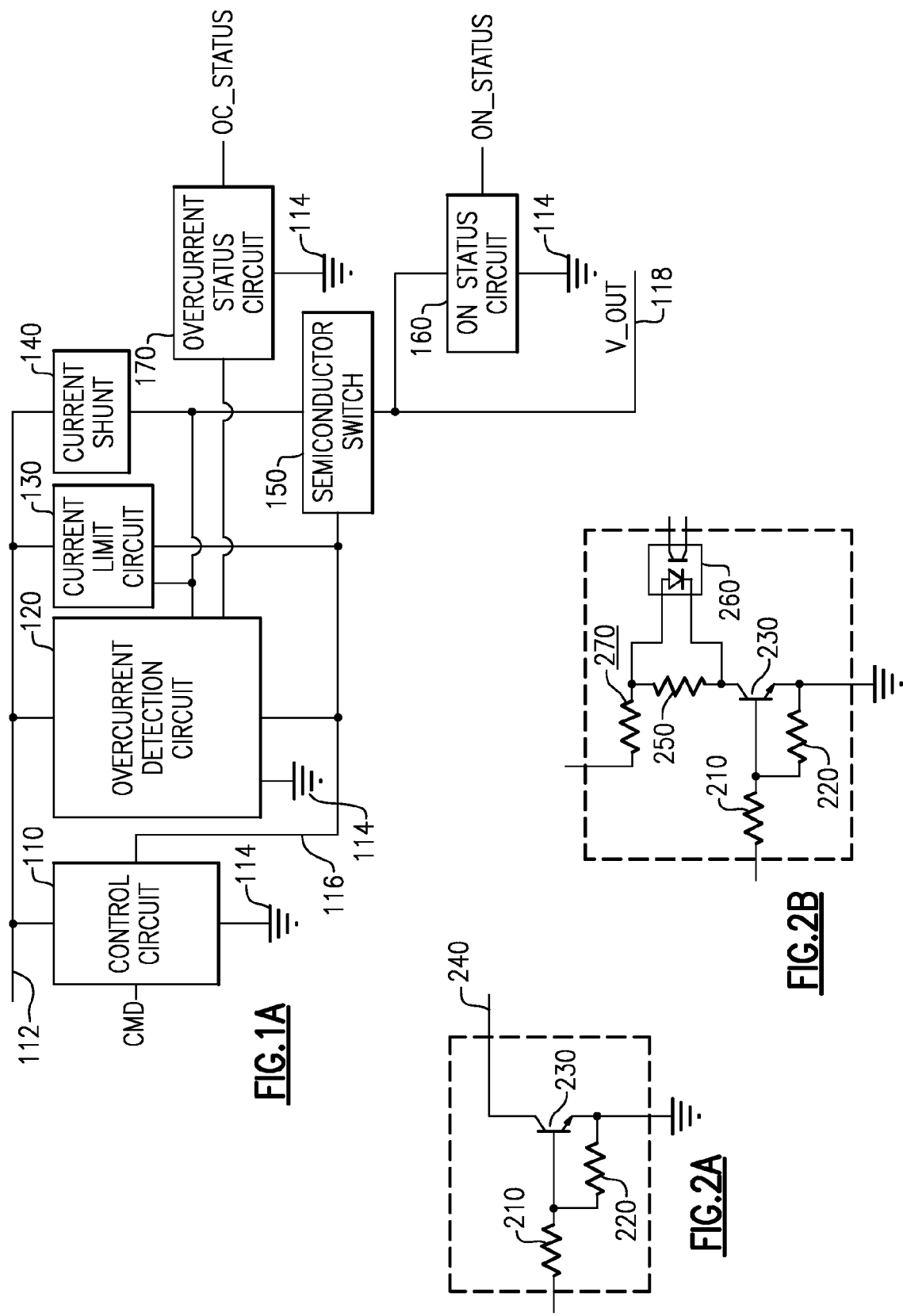

CONTROL CIRCUIT FOR CONTROLLING A SEMICONDUCTOR SWITCH SYSTEM

BACKGROUND OF THE INVENTION

This application relates generally to power distribution systems, and more specifically to overcurrent protection in DC power distribution systems.

In power distribution systems where DC power is distributed to multiple different loads, it is known to use a set of switches/relays in conjunction with a power system controller to control the power flowing to each load. In order to facilitate operation and power distribution to all of the loads, a controller, which is capable of controlling the state of each of the switches/relays in the system, is typically utilized.

Initially, systems designed in this way used mechanical relay switches. However, mechanical relay systems suffered from reliability problems. In order to improve reliability, many applications now use semiconductor switches instead of mechanical relays due to a longer life-span of the semiconductor switches. Use of semiconductor switches has the additional benefit of reducing the size of the circuit as well as reducing the weight.

Use of semiconductor switches necessitates a different style of controller than the controller used for mechanical relay switches. Existing semiconductor switch controllers are expensive to construct and maintain, are larger than desirable for use in many systems, such as aircraft power systems, and do not readily scale for different sized loads and trip currents.

SUMMARY OF THE INVENTION

Disclosed is a control circuit for controlling a semiconductor switch. The control circuit has a controller, a current shunt, an on status detector, an overcurrent detector. The on status detector is connected to a semiconductor in the semiconductor array, and monitors the on status of the semiconductor switch. The overcurrent detector monitors for the presence of an overcurrent. Each of the overcurrent detector and the on/off state detector additionally has an output signal indicating the state of the monitored semiconductor in the case of the on status circuit, and the overcurrent status in the case of the overcurrent detector.

These and other features of the present invention can be best understood from the following specification and drawings, the following of which is a brief description.

BRIEF DESCRIPTION OF THE DRAWINGS

FIG. 1A is a schematic diagram of an example semiconductor control circuit.

FIG. 2A is a circuit diagram illustrating an example overcurrent status circuit.

FIG. 2B is a circuit diagram illustrating an example overcurrent status circuit having an opto-coupler connection.

DETAILED DESCRIPTION OF THE PREFERRED EMBODIMENT

Figure 1B:
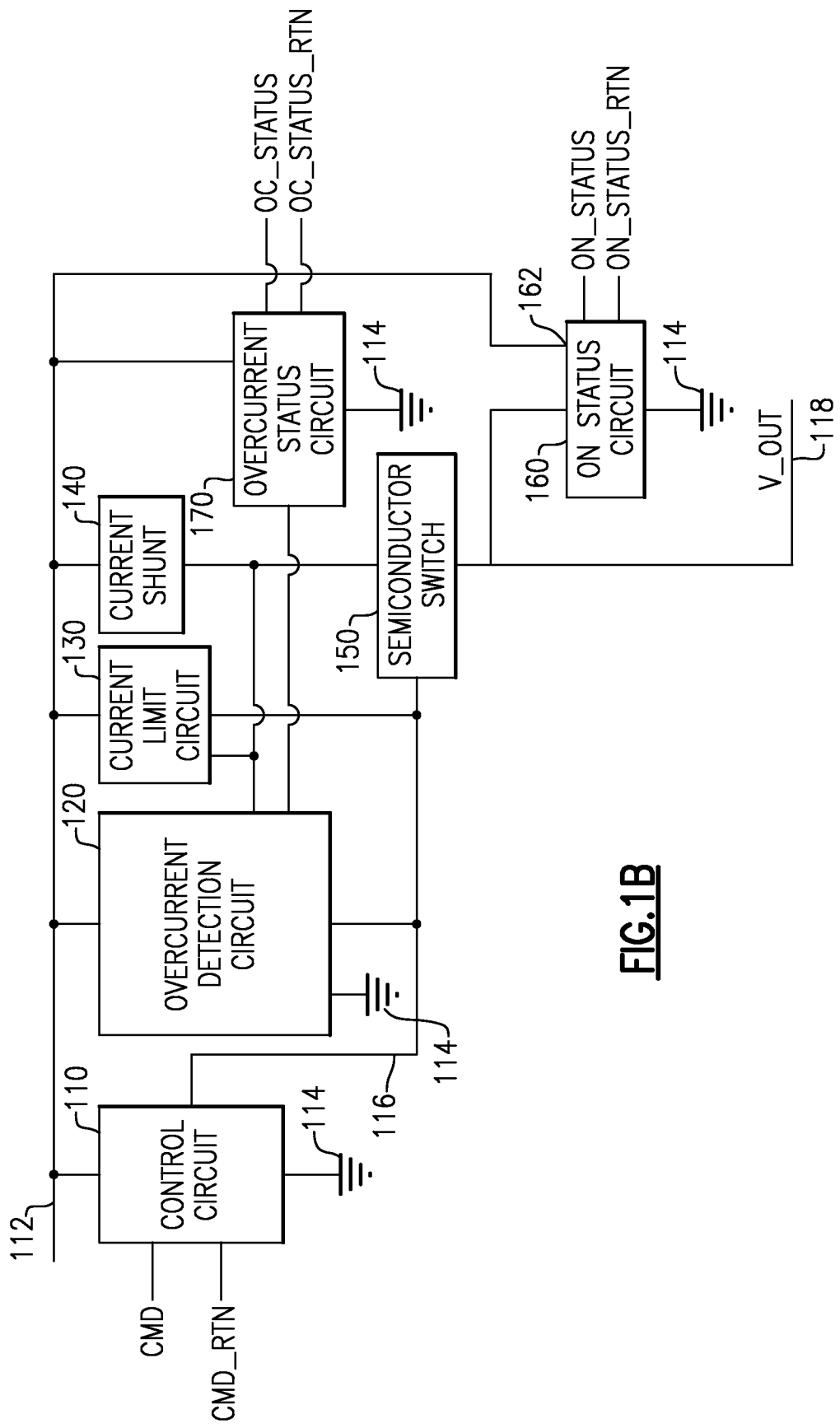
FIG. 1B is a schematic diagram of an example semiconductor control circuit having opto-coupler interface connections.

When controlling power to multiple DC loads using multiple semiconductor switches in a DC power distribution system, it is necessary for a controller to be able to monitor the state of each semiconductor switch and appropriately respond to any overcurrent conditions. FIG. 1 illustrates a box diagram of an electric circuit capable of controlling and monitoring a semiconductor switch 150. The circuit of FIGS. 1A and 1B could be adapted to control and monitor multiple semiconductor switches using methods known in the art.

The example of FIGS. 1A and 1B have a controller 110 connected to a first input power line 112 and to a neutral line 114. The controller 110 additionally has a control output 116 which connects to an overcurrent detection circuit 120, a current limiting circuit 130, and a semiconductor switch 150. The overcurrent detection circuit 120 is connected to the input power line 112, a current limiting circuit 130, a current shunt circuit 140, and an overcurrent status circuit 170. The current limit circuit 130 is also connected to the input power line 112. The semiconductor switch 150 has a gate input which accepts the control signal 116 and has a power input connected to the current shunt 140, and a power output connected to the output voltage signal 118 and to an on status circuit 160.

The solid state controller 110 of FIG. 1 controls the state of the semiconductor switch 150 by using a control signal, an output from the solid state controller 110 on the control signal output line 116. The control signal line 116 voltage is either 10-15V below the input power line 112 voltage, placing the semiconductor switch 150 in an on state, or the control signal line 116 voltage is equal to the power line 112 voltage placing the semiconductor switch 150 in an off state. When the control signal line 116 voltage is 10-15V below the input power line 112 voltage, the semiconductor switch 150 is turned on, and power is allowed to flow from the current shunt 140 through the semiconductor switch 150 to the output voltage 118. Additionally, power simultaneously flows through the semiconductor switch 150 to the on status detection circuit 160.

When the on status circuit 160 detects power flowing from the semiconductor switch 150, the on status circuit 160 begins outputting a semiconductor switch on signal 380 (illustrated in FIGS. 3A and 3B) which can used to monitor the status of the semiconductor switch system or for any other purpose. When the semiconductor switch 150 turns off, and thus ceases allowing power to flow through the semiconductor switch 150, the on status detection circuit 160 will no longer detect power, and therefore will cease sending the semiconductor switch on signal. In FIG. 1B, the on status circuit 160 has an additional connection 162 to the power line 112. The connection 162 allows the isolated on status circuit 160 to receive power for the optical isolation.

When an overcurrent condition occurs, the semiconductor switch 150, the current shunt 140, and the output wiring are subject to potential damage if the overcurrent condition is allowed to continue indefinitely. To protect the semiconductor switch 150, the current shunt 140, and any output wiring from damage, the example of FIG. 1 includes an overcurrent detection circuit 120 and an overcurrent status circuit 170.

The overcurrent detection circuit 120 detects the current through the current shunt 140. When the overcurrent detection circuit 120 detects a current that exceeds a preset threshold, it determines that an overcurrent condition is present in the circuit. When an overcurrent has been detected, the overcurrent detection circuit 120 clamps the control signal line 116 to about 1.5V less than the power line 112 voltage causing the semiconductor switch 150 to be latched off. After detecting an overcurrent condition, the overcurrent detection circuit 120 also outputs a signal to the overcurrent status circuit 170. Once the overcurrent status circuit 170 receives a signal from the overcurrent detection circuit 120, the overcurrent status circuit 170 switches on and begins outputting an overcurrent detected signal.

The overcurrent detected signal can be used to monitor the status of the semiconductor switch system and detect when an overcurrent event has occurred. The semiconductor switch 150 will remain latched off by the overcurrent detection circuit 120 until the input to the control circuit 110 is removed. Once the input signal has been removed, the overcurrent latch is removed, and the control circuit 110 can be commanded to turn the output on again. If the overcurrent condition still exists, the overcurrent detection circuit 120 will again detect the condition and latch the semiconductor switch 150 off.

The current limit circuit 130 detects the current through the current shunt 140. When the current limit circuit 130 detects that the current reaches a preset threshold, the current limit circuit 130 changes the voltage on the control signal line 116 to control and limit the current through the semiconductor switch 150. The preset threshold for the current limit is higher than the preset threshold for the overcurrent detection circuit ensuring that if the current limit is reached, the overcurrent detection circuit will latch off the semiconductor switch 150.

FIGS. 2A and 2B illustrate example circuits which could be used for the overcurrent status circuit 170 in the example of FIG. 1. FIG. 2A utilizes a pair of resistors 210, 220 to condition the overcurrent detected signal and a transistor 230 which switches on in the presence of an overcurrent detected signal. When the transistor 230 switches on a connection is made between the status indicator 240 and the neutral line. The connection allows current to travel through the status indicator 240, which in turn indicates that an overcurrent condition is present in the circuit.

The example of FIG. 2B performs the same function as the example of FIG. 2A, however it includes an opto-coupler 260 for optically isolating the overcurrent present signal from the overcurrent detection circuit 170, as well as from the remainder of the circuit. When the transistor 230 in the example of FIG. 2B turns on, current flows from input power line 112 through two resistors 270, 250 and the input side of the opto-coupler 260. The first resistor 270 conditions the current to a level compatible with an opto-coupler 260. The second resistor 250 is placed in parallel with the opto-coupler 260 and provides noise immunity for opto-coupler 260. When transistor 230 is on, current flows through the primary side of the opto-coupler 260, and the transistor output of the opto-coupler 260 is on. The opto-coupler 260 output is the overcurrent status signal, and is isolated from the remainder of the circuit via a light gap within the opto-coupler 260.

Figure 3A:
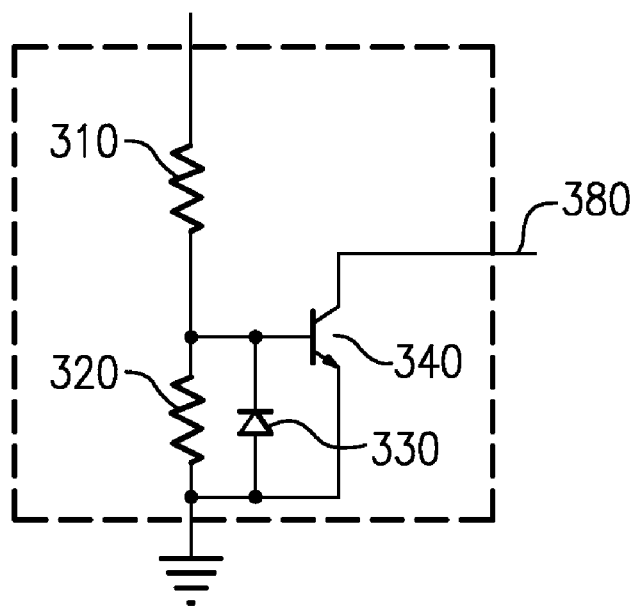
FIG. 3A is a circuit diagram illustrating an example semiconductor on status circuit.
Figure 3B:
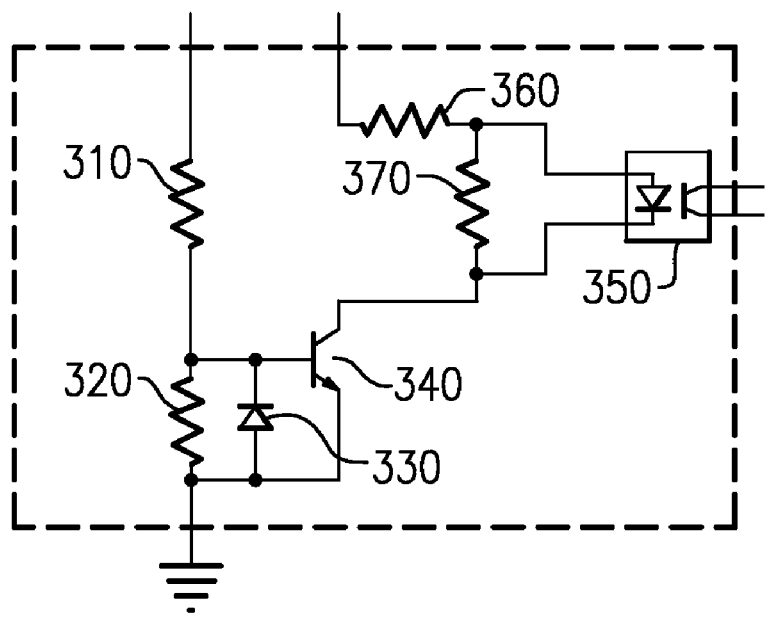
FIG. 3B is a circuit diagram illustrating an example semiconductor on status circuit having an opto-coupler connection.

FIGS. 3A and 3B illustrate example on status circuits 160 which could be used in the example of FIG. 1. FIG. 3A illustrates one example on status circuit 160, which utilizes two resistors 310, 320 and a diode 330 in conjunction with a transistor 340 to produce an on status signal. When the semiconductor switch 150 of FIG. 1 is in an on condition, current will pass through the semiconductor switch 150 into the on status circuit 160. Once in the on status circuit 160, current passes through the first resistor 310 and is then split between two paths. The first current path provides a control signal to the transistor 340 and the second current path returns to ground through the second resistor 320. This circuit configuration is operable to turn the transistor 340 on whenever the semiconductor 150 is on, thereby allowing current to flow through the on status indicator line 380, and provides an on status indicator in the same manner as the overcurrent status circuit 170 described above.

FIG. 3B operates in a similar fashion to the example of FIG. 3A, with the additional inclusion of an opto-coupler 350 for optically isolating the on status indicator line 380 from the remainder of the circuit. As in the overcurrent status circuit 160, a first resistor 360 conditions the current to be compatible with the opto-coupler 350. A second resistor 370 is placed in parallel with the opto-coupler 350 and provides noise immunity for the opto-coupler 350. When transistor 340 is on, current flows through the primary side of the opto-coupler 350, and the transistor output of the opto-coupler 350 is on. The opto-coupler 350 output is the overcurrent status signal, and is isolated from the remainder of the circuit via a light gap within the opto-coupler.

It is known that alternate designs could be used for the on status circuit as well as for the overcurrent status circuit, and fall within the above disclosure. Additionally a worker of ordinary skill in this art would recognize that certain modifications would come within the scope of this invention. For that reason, the following claims should be studied to determine the true scope and content of this invention.

What is claimed is:

1. A power distribution circuit comprising;
   a semiconductor switch;
   a current shunt connected to said semiconductor switch;
   an on status detector connected to said semiconductor switch and an on status output line such that a semiconductor on signal is output on said on status output line when said semiconductor switch is on;
   a controller connected to an input power source and to a control input of said semiconductor switch;
   an overcurrent detection circuit connected to said input power source, said semiconductor switch, and an overcurrent status circuit such that said overcurrent detection circuit is capable of detecting an overcurrent fault in said semiconductor switch; and
   the overcurrent status circuit additionally being connected to an overcurrent status signal line and to neutral such that an overcurrent present signal is output on said overcurrent status line when an overcurrent is present on said semiconductor switch.

2. The power distribution circuit of claim 1, wherein said overcurrent detection circuit is capable of tripping and latching off said semiconductor switch after detecting an overcurrent condition.

3. The power distribution circuit of claim 1, wherein said overcurrent status circuit comprises an overcurrent transistor connected such that the overcurrent transistor is in an on state while an overcurrent is detected and is in an off state while no overcurrent is detected.

4. The power distribution circuit of claim 3, wherein said overcurrent status circuit additionally comprises an opto-coupler optically isolating a status output of said overcurrent status circuit from said overcurrent status circuit.

5. The power distribution circuit of claim 1, wherein said on status circuit comprises an on status transistor connected in such a way that said on status transistor is in an on state when said semiconductor switch is on, and said transistor is in an off state when said semiconductor switch is off.

6. The power distribution circuit of claim 5, wherein said on/off status circuit additionally comprises an opto-coupler optically isolating an on status output from said on status circuit.

7. The diagnostic circuit of claim 1, wherein said semiconductor switch is a p-channel MOSFET.

8. A method for controlling a switching circuit comprising the steps of
   detecting an on status of at least one switching component, wherein said step of detecting an on status of at least one switching component comprises the additional steps of;

placing a detection transistor in an on state when said at least one switching component is on, and placing said detection transistor in an off state whenever said at least one switching component is off;

supplying a power signal to said detection transistor input; and indicating an on status of said at least one switching component whenever said detection transistor has a non-zero output;

detecting an overcurrent status of said at least one switching component; and overriding said detected on status when an overcurrent status is detected.

9. A method for controlling a switching circuit comprising the steps of:

detecting an on status of at least one switching component;

detecting an overcurrent status of said at least one switching component, wherein said step of detecting an overcurrent status comprises the additional steps of;

detecting a current through a current shunt;

outputting an overcurrent transistor control signal when an overcurrent is present;

utilizing a latch circuit to place an overcurrent transistor in an on state when an overcurrent transistor control signal is output, and placing said overcurrent transistor in an off state when no overcurrent transistor signal is output;

supplying an overcurrent status signal to said overcurrent transistor; and indicating an overcurrent status whenever said overcurrent transistor is outputting a non-zero output; and overriding said detected on status when an overcurrent status is detected.

10. The method of claim 8 or 9, wherein said step of overriding said detected on status comprises forcing an on status detector to report the on status of said at least one switching component as off.

* * * * *